United States Patent
Ofenloch et al.

(10) Patent No.: US 8,979,563 B2
(45) Date of Patent: Mar. 17, 2015

(54) ELECTRIC CONTACT MODULE AND ELECTRIC CONTACT BOX FOR AN ELECTRIC UNIT, AS WELL AS ELECTRIC EQUIPMENT AND ELECTRIC UNIT

(75) Inventors: Markus Ofenloch, Buerstadt (DE); Peter Kraemer, Grasellenbach (DE); Joergen Lundberg, Umea (SE)

(73) Assignees: Tyco Electronics AMP GmbH, Bensheim (DE); Tyco Electronics Svenska Holdings AB, Jaerfaella (SE)

( * ) Notice: Subject to any disclaimer, the term of this patent is extended or adjusted under 35 U.S.C. 154(b) by 0 days.

(21) Appl. No.: 13/405,150

(22) Filed: Feb. 24, 2012

(65) Prior Publication Data

US 2012/0220172 A1 Aug. 30, 2012

(30) Foreign Application Priority Data

Feb. 28, 2011 (EP) .................................... 11156281

(51) Int. Cl.
*H01R 29/00* (2006.01)
*H01R 9/24* (2006.01)
*H01R 9/26* (2006.01)
*G01R 1/04* (2006.01)
*G01R 31/327* (2006.01)
*H01R 13/631* (2006.01)

(52) U.S. Cl.
CPC .. *H01R 9/24* (2013.01); *H01R 9/26* (2013.01); *G01R 1/0416* (2013.01); *G01R 31/3277* (2013.01); *H01R 9/2425* (2013.01); *H01R 13/631* (2013.01)
USPC .......................................................... 439/171

(58) Field of Classification Search
CPC ........ H01R 13/06; H01R 29/00; H01R 13/03; H01R 23/7068; H01R 13/18; H01R 9/24; H01R 13/514; H01R 13/506; H01R 23/025; H01R 27/00

USPC ............. 439/682, 701, 924.1, 171, 170, 839, 439/174, 52, 713, 686

See application file for complete search history.

(56) References Cited

U.S. PATENT DOCUMENTS 3,766,513 A * 10/1973 Carre ............................. 439/518
4,131,328 A * 12/1978 Minar et al. ................... 439/106

(Continued)

FOREIGN PATENT DOCUMENTS

EP 0938160 A1 8/1999

OTHER PUBLICATIONS

Search Report issued by the European Patent and Trademark Office dated Jun. 14, 2011, for European Patent Application No. 11156281.5; 6 pages.

*Primary Examiner* — Phuong Dinh
(74) *Attorney, Agent, or Firm* — Faegre Baker Daniels LLP

(57) ABSTRACT

The invention relates to an electric contact module, particularly electric test module, for an electric unit, preferably an electric distribution unit such as an electric voltage or power distribution unit or an installation of an electrical substation of an urban electrical power system, having a casing having first electrical contact means electrically connectable by/to a first electric unit, and a slider having second electrical contact means electrically connectable by/to a second electric unit. The slider may be provided in a plurality of positions in relation to the casing. Locking recesses 132 and locking protrusions 232 may be used to set the positions of the slider. Furthermore, an electric contact box is disclosed having one or a plurality of electric contact modules according to the invention, wherein the electric contact box preferably comprises two, three or five electric contact modules or an integer multiple thereof.

10 Claims, 9 Drawing Sheets

(56) References Cited

U.S. PATENT DOCUMENTS

| | | | |
|---|---|---|---|
| 5,795,174 A * | 8/1998 | Saito et al. | 439/310 |
| 6,241,539 B1 * | 6/2001 | Sato et al. | 439/157 |
| 6,660,950 B2 * | 12/2003 | Fonseca | 200/51 R |
| 7,396,234 B2 * | 7/2008 | Sun | 439/32 |
| 7,762,846 B1 | 7/2010 | Whiteman, Jr. et al. | |

* cited by examiner

ELECTRIC CONTACT MODULE AND ELECTRIC CONTACT BOX FOR AN ELECTRIC UNIT, AS WELL AS ELECTRIC EQUIPMENT AND ELECTRIC UNIT

BACKGROUND

Field of the Invention

The present invention relates to an electric contact module, particularly a test module, and/or an electric contact box, particularly a test box, and/or an electric equipment, particularly a test system, for an electric unit, preferably an distribution unit, such as a voltage or power distribution unit or an installation of an electrical substation of an urban electrical power system. Furthermore, the invention relates to an electric unit, particularly a distribution unit.

SUMMARY OF INVENTION

In several fields of technology, especially for direct current applications, electrical voltage and/or power distribution, electrical power transfer, electrical power administration, communication, electrical measuring, verifying and/or testing, etc. electric contact modules or electric contact boxes comprising a plurality of contact modules are required. Contact boxes according to the prior art suffer from a lack in customizability with regard to their electrical contact means which are electrically connectable by/to an electric unit, for example an electric apparatus, an electric test equipment, a handle, etc. For example, for a leading/advancing and trailing/lagging plugging or separation of an electrical terminal or connector arrangement of a test-plug handle, at least two different types of contact modules for one contact box are needed.

It is an object of the invention to provide an improved electric contact module and/or an improved electric contact box having one or a plurality of contact modules. It is further an object of the invention to provide an accordingly improved electric equipment and/or electric unit. Hereby, the electrical contact means of a contact module should be customizable in such a way that a leading and trailing plugging or separation of an electrical terminal or connector arrangement is possible, i. e. a point in time of an electrical contacting should be adjustable. The customizability of the inventive contact box should not only be possible during an assembly of the contact box, but also later when the contact box is applied. According to the invention, it should easily be possible to fix the contact modules of the contact box to one another in a simple manner. Furthermore, two adjacent contact modules of a contact box should be easily electrically connected without using an external component. In embodiments of the invention, an insertion force of the terminal or connector arrangement should be adjustable.

The object of the invention is achieved by means of an electric contact module, particularly a test module, according to claim 1; an electric contact box, particularly a test box, according to claim 10; an electric equipment, particularly a test system, according to claim 11; and an electric unit, particularly a distribution unit, according to claim 12. Preferably the invention is applicable in or as an electric unit, preferably a distribution unit, such as a voltage or power distribution unit or an installation of an electrical substation of an electrical power system. Other applications are of course possible, which is explained below. Preferred embodiments, features and/or advantages of the present invention are defined in the dependent claims and the following description.

According to the invention, the electric contact module comprises a casing having first electrical contact means electrically connectable to/by a first electric unit, and a slider having second electrical contact means electrically connectable by/to a second electric unit. Hereby, the slider may be provided in a plurality of positions in relation to the casing. —Furthermore, according to the invention, the electric contact box comprises one or a plurality of inventive contact modules, wherein the contact box preferably comprises two, three or five contact modules or an integer multiple thereof. Preferably, the contact box comprises 12 or 24 contact modules. —Moreover, according to the invention, the electric equipment comprises an inventive contact box and an electric apparatus like a handle or a test-plug handle. —Additionally, according to the invention, the electric unit comprises an inventive contact module and/or an inventive contact box.

According to the invention the electrical contact points or areas of the electric contact modules or an electric contact box are configurable in a simple manner. For example, in the modularly arranged contact modules of a contact box, two or more different contact points may be chosen, i. e. leading and trailing plugging or separation (vice versa) of an electrical terminal, connector arrangement or connector is possible. The contact modules may be delivered to a customer in an already configured state, or the contact modules may have a basic adjustment for later configuration at the customer. Hence, the contact points of the contact box may subsequently be adapted to new demands.

The sliders may be lockable and unlockable in the electric contact box (see below), whereby these sliders may be lockable in a tamper-proof manner. In multi-pole contact boxes, an insertion force of the terminal may be influenced or adjusted due to the displaced contact points of the sliders. In time-sensitive and/or security-relevant switching operations, the time of electrically contacting the contact points may be freely adjusted. By applying an inventive electrical switch (see also below) comprising a moveable or slidable inventive electrical shifter, it is possible to electrically connect two contact modules in a simple manner. Therefore, the positions of the sliders of the involved contact modules does not matter.

The first electrical contact means of the casing is designed in such a manner that it may be fixedly and electrically connected to the first electric unit, wherein the casing, the electric contact module or the electric contact box may be part, for example an integral part, of the first electric unit. The slider and/or its second electrical contact means is/are designed in such a manner that it is/they are suitable for an electrical connection with an electrical connection assembly, preferably electrically contactable by an electrical terminal, a connector arrangement or a connector of the second electric unit.

The slider is mountable, particularly lockable, in a plurality of positions at/in the casing, wherein the slider may preferably take over two, three, four, five or more positions at/in the casing. Furthermore, the slider and the casing may particularly comprise mutual corresponding locking elements, wherein the slider comprises at least one locking protrusion and the casing comprises at least one locking recess or locking impression, or vice versa. Preferably, the slider comprises one locking protrusion and the casing comprises a plurality of locking recesses or locking impressions. In embodiments of the invention, the locking protrusion is provided at a locking lance of the slider and the locking recesses or impressions are provided particularly in a wall, preferably an outer wall, of the casing.

In embodiments of the invention, the slider may be fixed in a plurality of positions in relation to the casing, whereby particularly the slider comprises a plurality of fixing means and the casing comprises merely one fixing means. Hereby, the fixing means of the slider may comprise a plurality of through bores and the fixing means of the casing may only be one through bore. In a fixing position of the slider in relation to the casing, one through hole of the slider is in a coaxial line with the through hole of the casing, whereby a fixing rod my be put through these through holes, fastening the slider and the casing to one another.

An electrical connection between the first electrical contact means and the second electrical contact means of the contact module is at least partially a flexible connection what is preferably achieved by means of an electrical wire. An electrical contacting between a respective inner electrical contact element of the casing and an electrical wire and/or an electrical contacting between a respective (inner) electrical contact element of the slider and the wire is preferably achieved by soldering and/or crimping. —The second electrical contact means comprise electrical contact elements, particularly two electrical contact springs spring-loaded against each other, wherein in a state of rest of the two contact springs, these contact springs abut against each other at their longitudinal end-sections, for what only one or both contact springs preferably comprise a projection.

In embodiments of the invention, the casing is substantially shaped like a box, a block, a cage, a case, a tub or a partially open module, and the slider is substantially shaped like a cage, a case, a tub, a module or a plate. Hereby, the casing and the slider may be designed in such a manner that the slider is partially guidable at/in the casing, for which purpose the casing and/or the slider preferably comprise a guiding face, a guiding projection and/or a guiding wall. Furthermore, the casing may comprise a rib for guiding the slider which in turn comprises a longitudinal recess, wherein the rib may partially and form-fittingly be contained in the longitudinal recess.

For an automated positioning of the slider and/or the casing, the slider and/or the casing may comprise a positioning means for moving or shifting the slider in relation to the casing or the casing in relation to the slider, or both. Such a positioning means may be a recess such as a bore or a through bore, or a protrusion such as a bar, for a mechanical engagement by a positioning automat. Further, an inductive positioning is applicable, whereby the slider and/or the casing comprise a ferroelectric part, for example a metal plate. Moreover, the slider and/or the casing may comprise a face for a vacuum gripper which positions the slider in relation to the casing and/or the casing in relation to the slider. Furthermore, a spring mechanism is applicable.

In preferred embodiments of the invention, the electric contact module comprises an electrical switch or shifter for electrically contacting the contact module, for which purpose the contact module, particularly its slider, comprises an electrical contact element. Hereby, the electrical shifter may be designed in a such a way that it may electrically contact the electrical contact element of its or a first contact module, and/or an electrical contact element of a second electric contact module which is preferably a directly adjacent contact module. The shifter and/or an electrical conductor of the shifter is designed in such a manner that it may electrically contact both contact elements of adjacent contact modules, irrespective of a relative position of the sliders of these contact modules with regard to each other.

Hereby, the electrical shifter and/or the electrical conductor of the shifter may be designed in such a manner that it may electrically contact both, only one or none of the electrical contact elements of the adjacent electric contact modules, also irrespective of a relative position of the sliders of these contact modules among each other. Moreover, the shifter and/or the conductor of the shifter has/have a comparatively large and preferably linear free moving space at/in the contact module or the slider, whereby the shifter is designed in such a manner that it electrically bridges all relative positions of both contact elements of the sliders of the adjacent contact modules among each other.

In embodiments of the invention, the electrical shifter is provided at a longitudinal side of the slider or the casing of the electric contact module in a slidable manner and may assume a position in which it either electrically contacts the electrical contact element of the contact module and/or the second adjacent contact module, or not. Hereby the shifter may be guided at the longitudinal side of the slider or the casing, for which purpose particularly the slider or the casing and the shifter comprise guidance elements, whereby the slider or the casing preferably comprise a rib and the shifter preferably comprises a mutual corresponding recess, or vice versa.

The shifter may be designed in such a way that it electrically and/or mechanically bridges a distance between two directly adjacent sliders or contact modules. Furthermore, the electrical conductor of the shifter may be designed in such a way that it electrically connects these two directly adjacent sliders or contact modules to one another, irrespective of a relative position of the sliders of these contact modules among each other. In a mounting position of the electric contact module in the electric contact box it is preferred that the shifter may be directly or indirectly actuated from an outside of the contact box. For this purpose, the shifter may for example be visible at the outside of the contact box or may be moved by an actuating element which may be an external part or a component part of the shifter.

In embodiments of the invention, the electrical contact element of the contact module is mounted in a position at/in the slider in which it is electrically contactable by the electrical contact means of the slider, i. e. preferably one contact element of the contact means and particularly in an open position of this contact element. Furthermore, the contact element of the electric contact module may protrude at least from one outer face of the contact module, particularly an outer face of the slider and/or the casing, whereby the contact element is preferably an electrical contact pin. The respective outer face is preferably an outer face having a comparatively large area.

The electrical conductor of the shifter may be shaped like a clamp, wherein the two legs of the clamp-like conductor may electrically contact the contact elements of the first and the second electric contact module. Hereby, both legs of the conductor preferably comprise a slit in which the contact element of the slider or the electric contact module, respectively, may be received in a plurality of positions, whereby the slit is preferably a longitudinal slit having a portion with a constant diameter. —The shifter may comprise a substantially cage-like, or a substantially cube- or block-shaped body at/in which its conductor is provided, whereby preferably both legs of the clamp-like conductor lie on opposite outer faces of the body of the shifter.

In preferred embodiments of the invention, the electric contact module or the casing and/or the slider, respectively, is/are designed in such a manner that the first electric unit which is electrically connectable to/by the first electrical contact means of the casing may comprise a relay or a protection relay, and/or the second electric unit which is electrically connectable to/by the second electrical contact means of the slider may be an electrical apparatus such as an electrical test equipment or a handle, such as a test-plug handle. The contact module, or the casing and/or the slider may be mechanically and/or electrically designed in such a way that a relay or a protection relay of the first electric unit and/or an electrical apparatus such as a handle or a test-plug handle as second electric unit is mechanically and/or electrically connectable.

BRIEF DESCRIPTION OF THE DRAWINGS

Preferred exemplary embodiments of the present invention are explained below in more detail with reference to the accompanying drawings in which.

Figure 1:
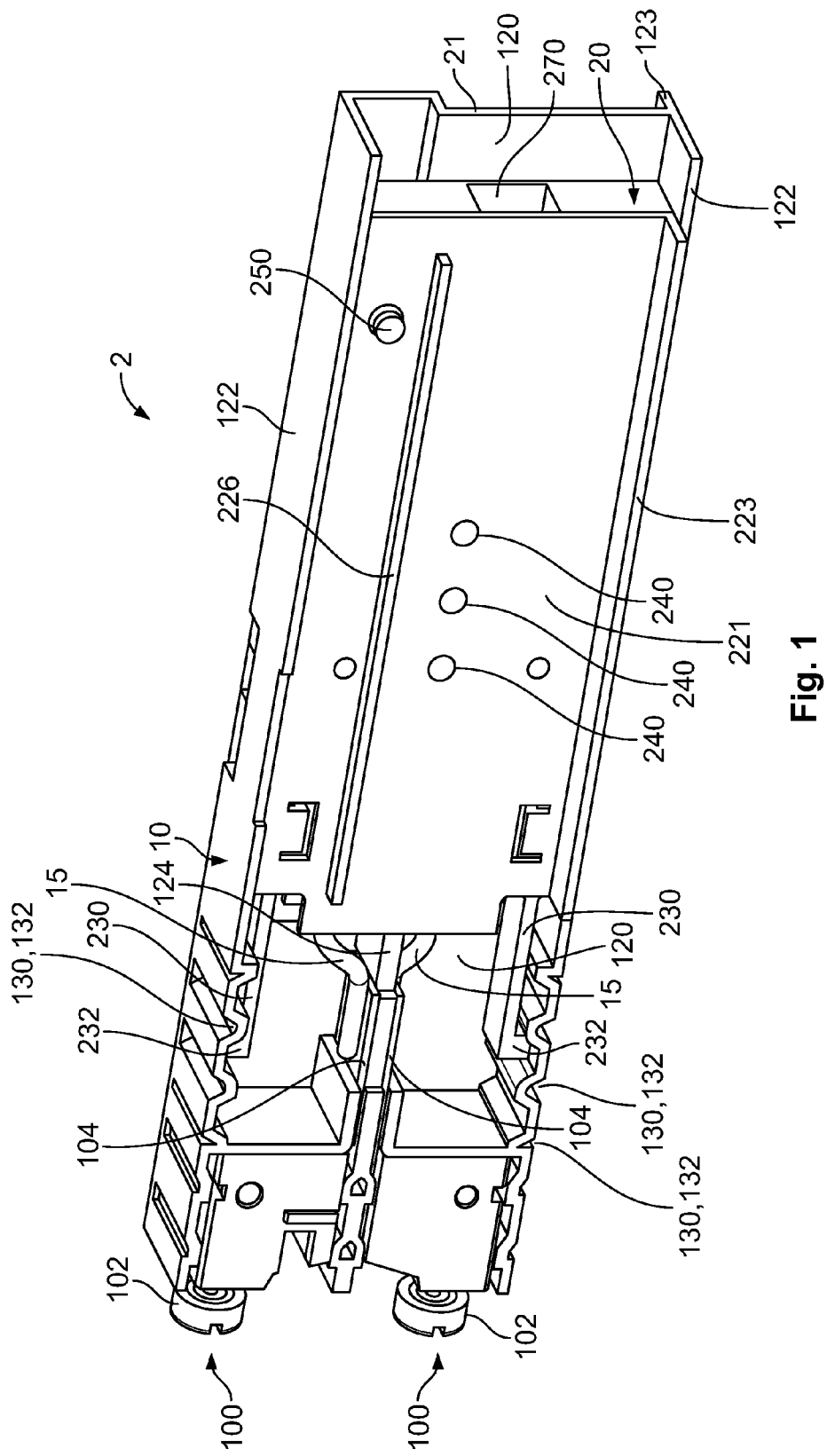
FIG. 1 shows a three-dimensional side view of a first embodiment of an inventive electric contact module for a first embodiment of an inventive electric contact box.
Figure 2:
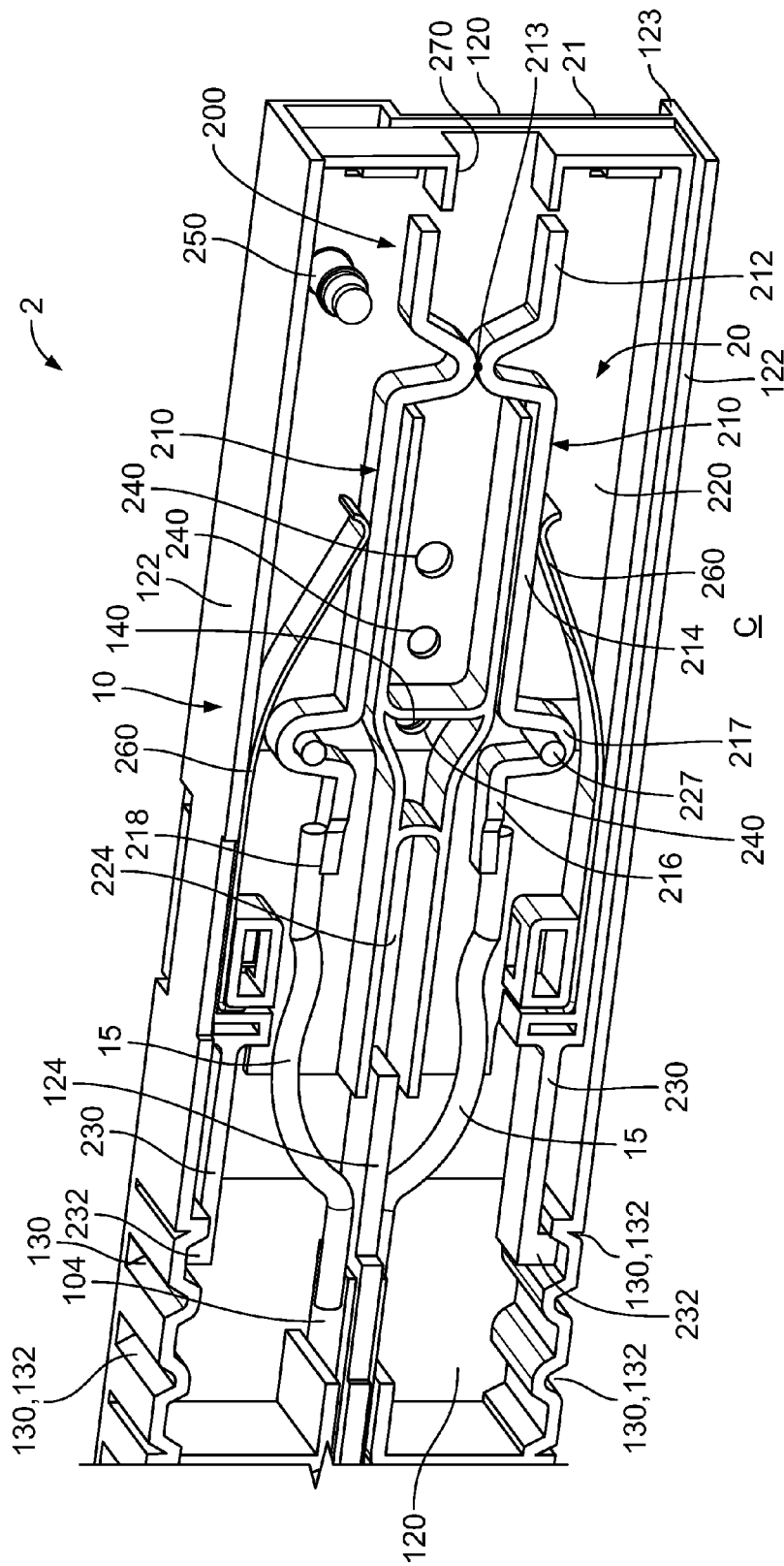
FIG. 2 a three-dimensional side view of an interior of the contact module from FIG. 1, comprising a casing and a slider.

In the following description of the drawings, the invention is explained as an application, particularly as a test system for an electric voltage and/or power distribution unit or for an installation of an electrical substation of an (urban) electrical power system. However, the invention is not restricted to such applications. Moreover, the invention may be used in all industrial and technical fields, particularly for direct current applications, for an electric unit, apparatus, device, means, installation, equipment, system, etc. for a multipole plug assembly, a transformer, hybrid applications (see below), etc. Thus, the invention is applicable in the technical fields of metal industry, electrical and/or electronic industry, automotive industry, automation technology, electrical distribution, electrical power transfer, electrical power administration, communication, electrical measuring, verifying and/or testing, etc.

An electric equipment or test system for testing protection relays comprises at least one inventive electric contact or test box 1 (cf. FIG. 6-9) having preferably a plurality of inventive electric contact or test modules 2 (cf. FIG. 1-5) and an electric device (not shown) such as a test-plug handle or a block-plug handle (parts of them are shown in FIG. 3-6). The contact box 1 may also be used for other testing needs not directly associated with relays, such as for switchboards, voltmeters, etc. The test system, particularly its contact box 1, may be used where testing would otherwise require disconnection of an instrument transformer's secondary or control wiring. It may also be used advantageously in the testing of other (complete) relay systems, even if each individual relay has its own test switch, contact box 1 (test box 1) or contact module 2 (test module 2).

When the handle is inserted into the contact or test box 1, preparations for testing are automatically carried out in a proper sequence, i.e. blocking of tripping circuits, short-circuiting of current transformers, opening of voltage circuits, making relay terminals available for secondary inspection. When a number of protection relays are to be tested, the handle only needs to be moved from the contact box 1 of one relay to the contact box 1 of the other without altering previously made electrical connections. The test system guarantees a fail-safe sequential disconnection of current, voltage and trip circuits when the handle is inserted. When the handle is withdrawn, it allows the relay to stabilise before the trip circuits are restored, which prevents inadvertent tripping.

FIGS. 1 to 5 show a single contact module 2 for a contact box 1, mainly comprising a casing 10 or housing 10 and as a second part a slider 20 which is mountable in several positions in relation to the casing 10. Therefore, the slider 20 may be provided in a moveable or slidable manner relative to the casing 10, whereby the slider 20 may at least be partially accommodated in an inside of the casing 10. Further, the slider 20 may not be provided in a moveable or slidable manner in relation to the casing 10, but may be insertable or pluggable into the casing 10 (not shown) in several positions. Therefore, the casing 10 and the slider 20 may comprise mutual corresponding fixing or locking elements; a screw connection, a clipping or any other joining technique may also be utilised. In embodiments of the invention, the slider 20 may be fixable at/in the casing 10 (see below).

The slider 20 has a particularly cage- or box-like structure having a base 220 or base plate 220 and/or a cover 221 or cover plate 221. The casing 10 in turn also has a preferably cage- or box-like construction comprising a main frame 120 and a wall 122 or sidewall 122, whereby preferably one or two sides of the particularly substantial cubical contact module 2 are left open and accessible from an outside; for example for laterally mounting the slider 20 and/or an access of an electrical connector 400 from a front face side 21 of the contact module 2, like a male (see FIGS. 3 to 6) or female connector 400 (not shown). The wall 122 and/or a base area of the casing 10 may guide the slider 20 in the casing 10, whereby an additional guiding element may be provided at/in the casing 10 (not shown).

The casings 10, the sliders 20 and/or the contact modules 2 are preferably designed in such a manner that two directly adjacent contact modules 2 may be mounted to each other in a simple manner. This may for example be achieved by a form-locked join or an at least partial positive connection of the respective sides of two directly adjacent contact modules 2, which is for example shown in FIGS. 7 and 8. Here, the free (longitudinal) ends of the two sidewalls 122 of one contact module 2 abut at a preferably closed lateral side of the directly adjacent contact module 2. Also, partially mutual corresponding lateral sides may be applicable which is of advantage when the casing 10 is laterally closed (not shown, the drawing shows always casings 10 with one fully open lateral side).

In an embodiment of the invention, in all functional positions of the slider 20 with respect to the casing 10 the slider 20 is fully accommodated in a longitudinal direction in the casing 10 (see FIGS. 1 to 6). In an other embodiment of the invention, the sliders 20 are only partially accommodated in the respective casings 10 of a contact box 1 (see FIGS. 7 and 8). Combinations of these two embodiments are applicable. —In a lateral direction, i.e. a perpendicular direction to the longitudinal direction, the slider 20 may also be fully accommodated in the casing 10 (see FIGS. 1 to 8) or the slider 20 may protrude laterally from the casing 10 (not shown). —The contact box 1, i.e. the contact modules 2, are constructed in such a manner that every slider 20 may occupy a position irrespective of a position of an adjacent slider 20 or contact module 2.

For a connection of one contact module 2 to a directly adjacent one, i. e. a mechanical connection of the slider 20 of one contact module 2 to a directly adjacent contact module 2, the slider 20 or its cover plate 221 may comprise a guidance element 223 protruding from its contact module 2, such as a rib 223 or a protrusion 223. This guidance element 223 may glide and/or sit on/at a guidance element 123, for example a rib 123 or a protrusion 123, of the directly adjacent contact module 2, i.e. its casing 10. This is preferably done by two longitudinal ribs 123, 223 abutting against each other in longitudinal direction. —The contact modules 2 of one contact box 1 are preferably constructed in such a manner that they may be stuck and also preferably locked to each other (not shown).

The casing 10 comprises electrical contact means 100 (see FIGS. 1 and 9) electrically connectable or linkable by/to a first electric unit, apparatus, device, means, installation, equipment, system, etc. (not shown). These contact means 100 of the casing 10 are also denoted as first contact means 100. The casing 10, the contact module 2 or the contact box 1 may be part of this first electric entity. The first contact means 100, i. e. the casing 10, preferably comprises outer electrical contact elements 102 for example cage clamps, screw-type terminals, etc. The respective outer contact element 102 is electrically connected to an inner electrical contact element 104 of the casing 10, which in turn is electrically connected to electrical contact means 200 of the slider 20.

The contact means 200 of the slider 20 are also denoted as second contact means 200 which are electrically connectable or linkable by/to a second electric unit, apparatus, device, means, installation, equipment, system, etc. (also not shown). An electrical connection 15 between the first and the second contact means 100, 200 is preferably a flexible electrical connection 15 which is particularly achieved by an electrical cable 15 or a wiring 15. Therefore, the inner contact element 104 may for example be a connection pad 104, whereby the cable 15 may be soldered onto the pad 104. Also, a crimping or another electrical connection method is applicable. On the other end, the cable 15 is electrically connected to the second contact means 200, which may also be achieved by soldering, crimping, etc. Instead of soldering or crimping, a mechanical clamping is applicable, or vice versa; this is also applicable to the other electrical connections of the contact module 2.

The second contact means 200 preferably comprise two electrical contact elements 210, particularly two electrical contact springs 210 spring-loaded against each other. Hereby the respective spring load may result from an inner pre-stressing of a contact spring 210 and/or an additional mechanical spring 260, particularly a slat spring 260, a lamella spring 260, a spiral spring (not shown), etc. Between a longitudinal tip end-section 212 of one contact spring 210 and a middle-section 214 of the contact spring 210, an electrical contact point 213 or contact area 213 for an electrical connection by/to the second electric unit (terminal 40, see below) is provided. Preferably the contact area 213 of the contact spring 210 is a bending 213 or a projection (not shown).

In a state of rest C of the two contact springs 210, the contact areas 213 of the contact springs 210 abut against each other which corresponds to a closed position C or a closed condition C of the contact springs 210. Thus, electricity may pass through the contact springs 210 over the contact area 213 short-circuiting the first contact means 100. In an open position O or an open condition O of the contact springs 210, the connector 400 for example of an electrical terminal 40 is inserted between the contact springs 210 (see FIGS. 3 to 5); this corresponds to the loaded case O of the contact springs 210. Due to a configuration of the connector 400, different electrical potentials may e.g. be applied to the contact springs 210 and thus to the first contact means 100.

Figure 6:
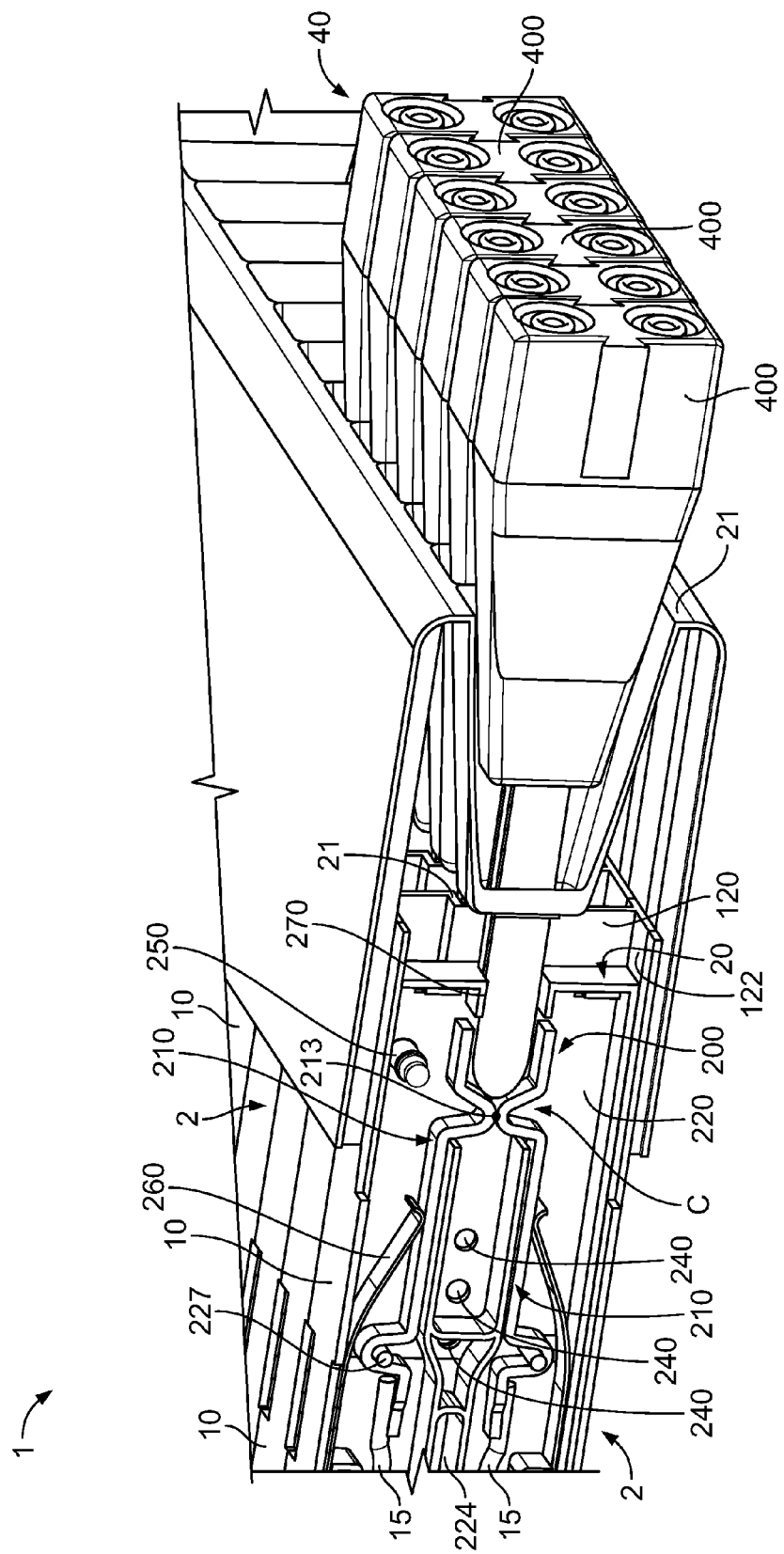
FIG. 6 a partially perspective side view of the first embodiment of the contact box during an insertion of an electrical terminal.
Figure 9:
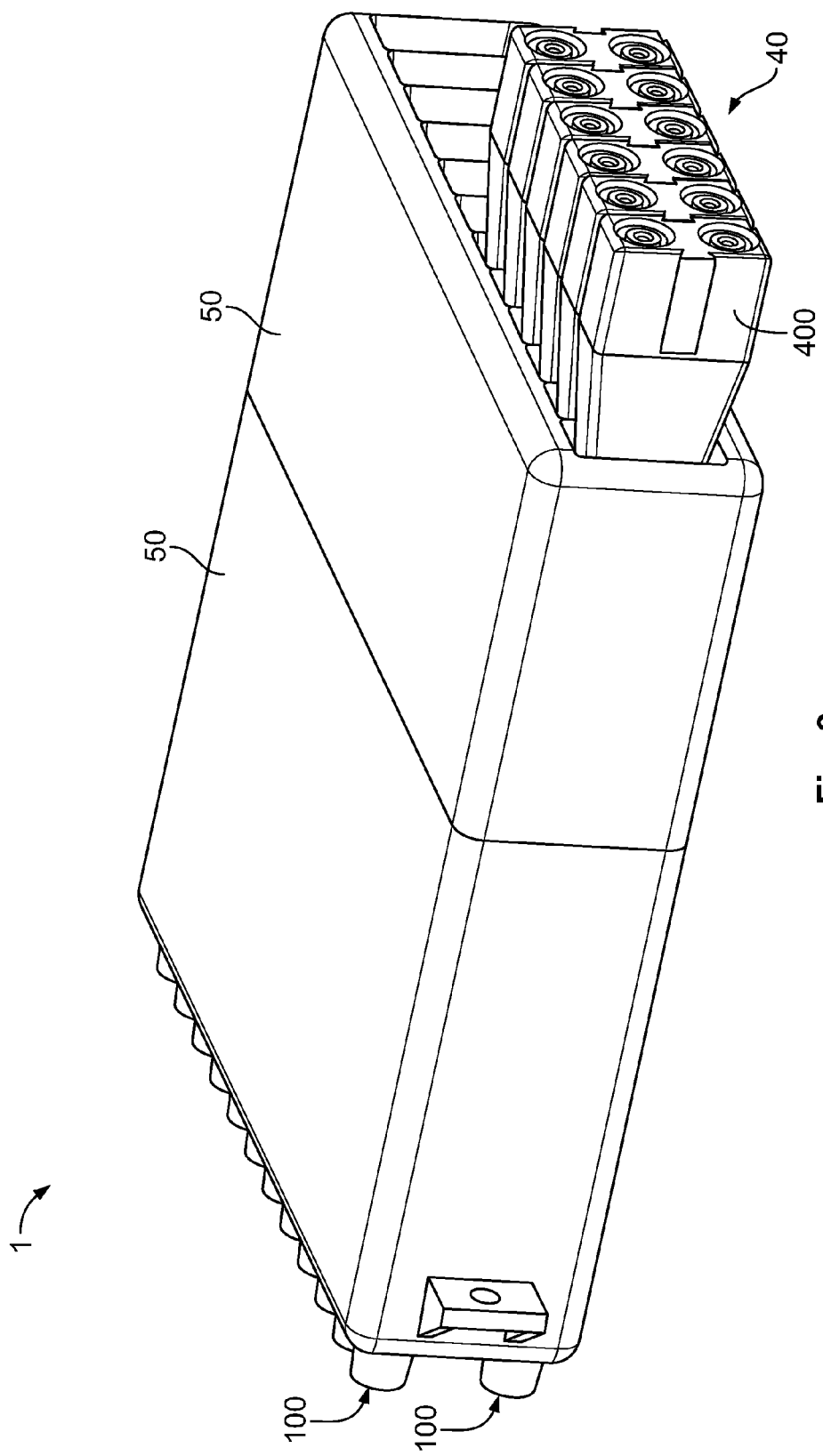
FIG. 9 a perspective side view of the inventive electric contact box ready for mounting at a first electric unit.

Now a test, for example at a relay which is electrically connected to the first contact means 100, may be performed via the terminal 40 (see FIGS. 6 and 9). The terminal 40 may for example be an electrical connector arrangement of the second electric unit, apparatus, device, means, installation, equipment, system, etc. That is for example an electric apparatus, an electric test equipment, a (test-/block-plug) handle, etc. Therefore, the terminal 40 may comprise one or a plurality of connectors 400, preferably as many connectors 400 as a contact box 1 comprises contact modules 2. The connectors 400, preferably the tip ends of the connectors 400 may be flush, i. e. they may all be in one line. A leading or advancing, and/or a trailing or lagging plugging or separation, respectively, is preferably not only realised by the configuration of the terminal 40.

On a side remote to the tip end-section 212 of the contact spring 210, between the middle-section 214 and a longitudinal end-section 216 of the contact spring 210, the contact spring 210 comprises a bearing seat 217, preferably a bearing seat 217 of a pivot bearing 217, 227 of the contact spring 210. The bearing seat 217 may be a bending 227 in the contact spring 210. The pivot bearing 217, 227 further comprises a bearing pin 227 or a journal 227, a pivot 227, etc. protruding from the preferably integral base 220 of the slider 20. Further, the contact spring 210 comprises an electrical contact area 218 for an electrical connection to the cable 15. This contact area 218 is preferably part of the tied end-section 216 of the contact spring 210 and is preferably constructed as a connection pad 218 or a crimping section.

According to the invention, the slider 20 may take over a plurality of distinct positions with regard to the casing 10. In the shown embodiments the slider 20 may take over three different positions in the casing 10 (cf. FIGS. 3 to 6). However, it is possible to apply only two or more than three different positions of the slider 20 in relation to the casing 10. According to one embodiment of the invention, the slider 20 is lockable in a plurality of positions relative to the casing 10. Therefore, the slider 20 and the casing 10 comprise mutual corresponding locking elements 130, 230, whereby the two parts will mutually lock-up or will snap-fit with each other when the slider 20 is in one correct position relative to the casing 10. The mutual corresponding locking elements 130, 230 are preferably a locking recess 132 or a locking impression 132, and a locking protrusion 232, or vice versa.

Particularly the locking element 230 of the slider 20 is a locking lance 230 protruding from a rear end of the slider 20 in the direction to the first contact means 100 of the casing 10. Preferably two locking lances 230 on opposite longitudinal sides of the slider 20 are provided, being substantially flush with a main body of the slider 20. Each locking lance 230 preferably comprises a locking protrusion 232 which protrudes to the outside of the slider 20. In accordance therewith, the casing 10 comprises a plurality of locking recesses 132 for each locking lance 230. In the shown embodiments, the casing 10 comprises three locking recesses 132 for each locking lance 230, being provided in the sidewall 122 of the casing 10. Preferably the locking recesses 132 are locking impressions of the sidewall 122.

Figure 3:
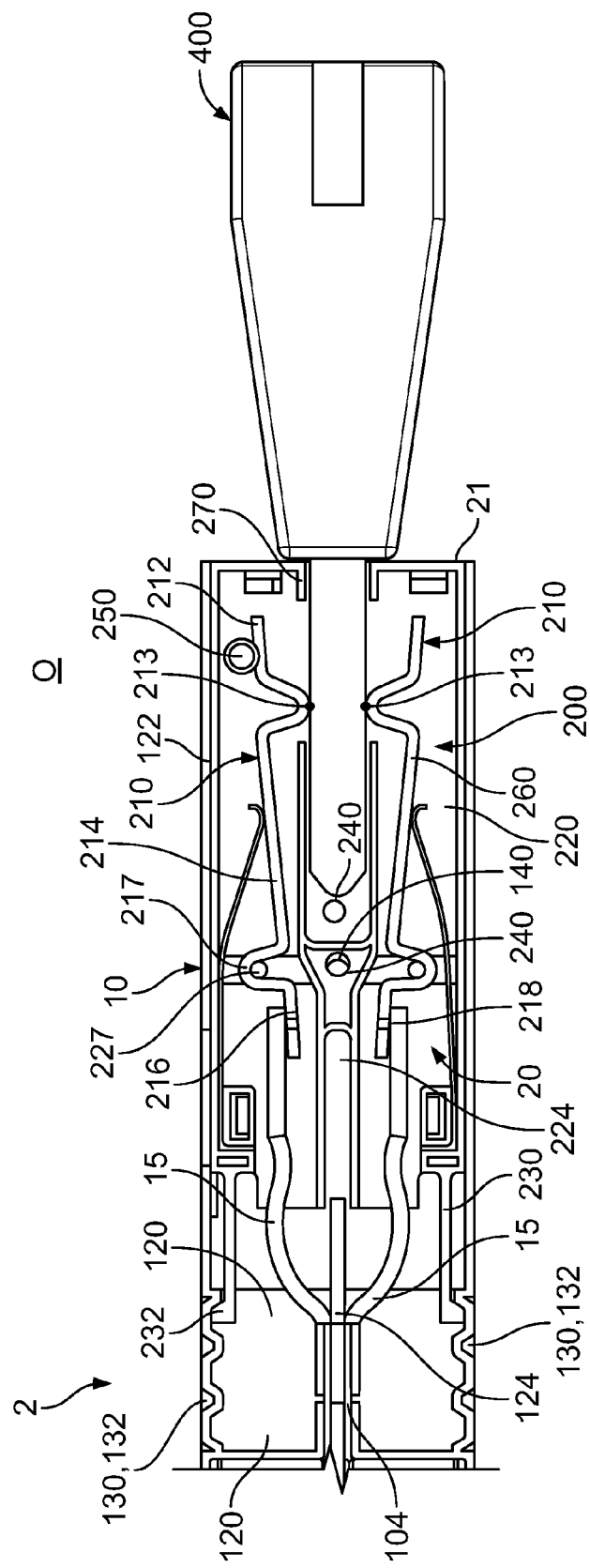
FIG. 3 a planar side view of a first locking position of the slider in relation to the casing, for leading plugging or trailing separation, respectively.
Figure 4:
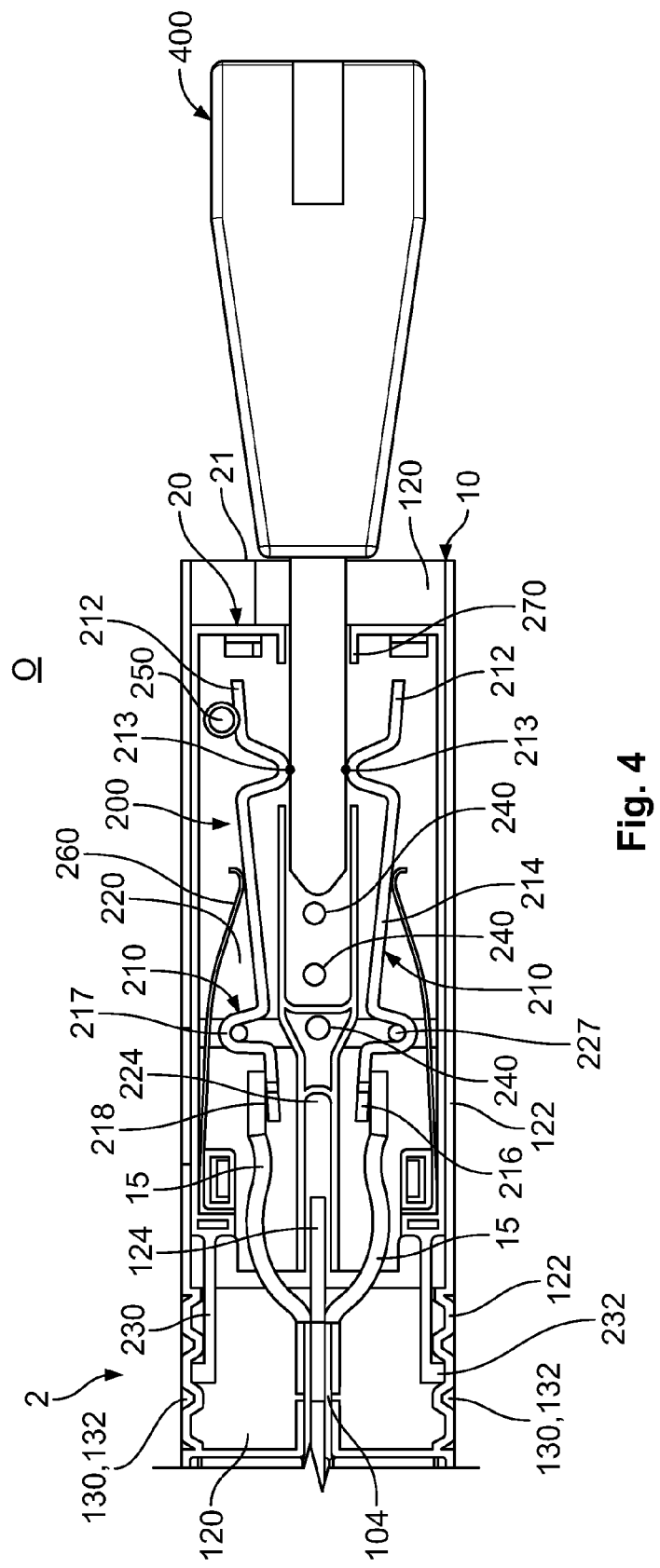
FIG. 4 a planar side view of a second locking position of the slider in relation to the casing.
Figure 5:
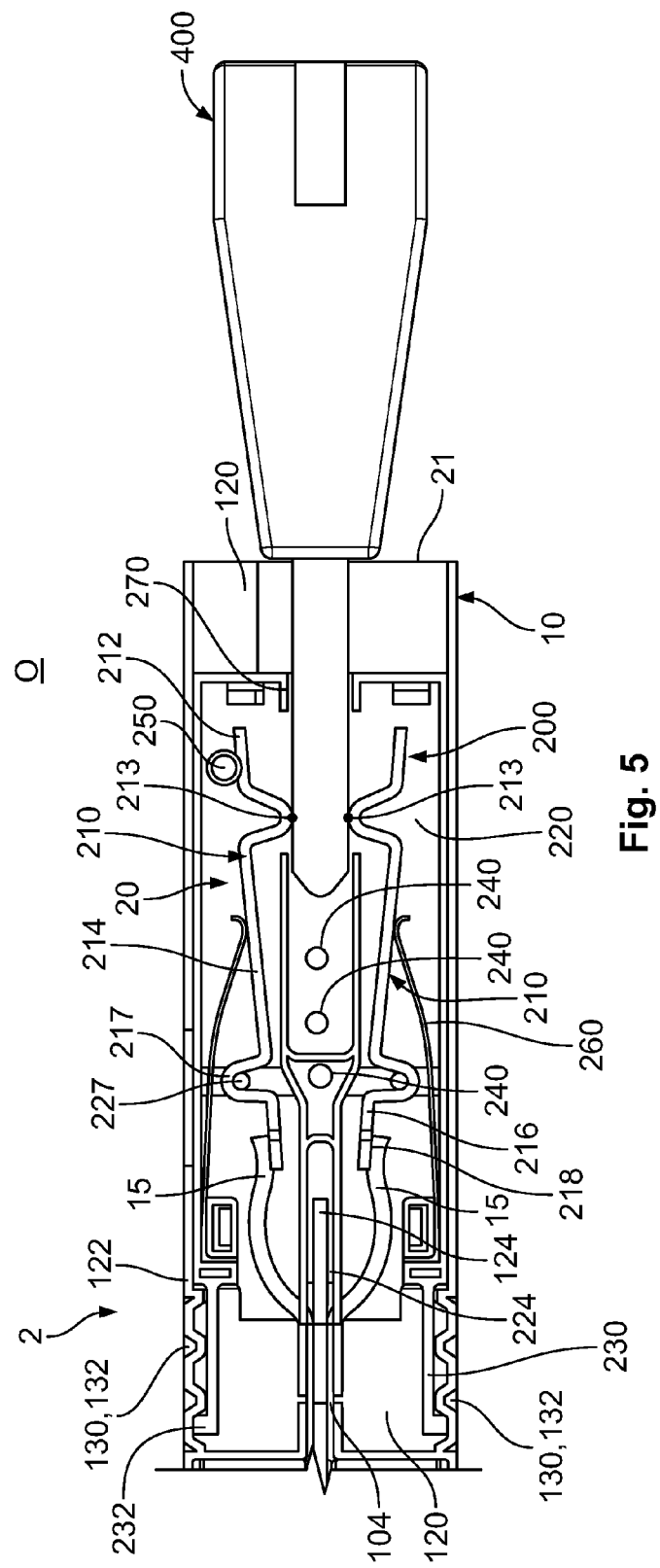
FIG. 5 a planar side view of a third locking position of the slider in relation to the casing, for trailing plugging or leading separation, respectively.

For a leading plugging and/or a trailing separation of the terminal 40 or the respective connector 400, the slider 20 takes over a position shown in FIG. 3, whereas for a trailing plugging and/or a leading separation of the terminal 40 or the respective connector 400, the slider 20 takes over a position shown in FIG. 5. FIG. 4 marks a neutral position between leading and trailing plugging or separation, respectively. In each position of the slider 20 relative to the casing 10, the locking protrusions 232 of the locking lances 230 engage in associated locking recesses 132 of the casing 10 (cf. FIGS. 3 to 5). A spring force of the locking lances 230 may be adjusted by their dimensions, for example their length. Furthermore, the locking lances 230 do not need not be identical and may for example be arranged with mutual offset.

For leading plugging, the contact area 213 of the slider 20 lies near the front face side 21 of the contact module 2 (see FIG. 2, 3) and near a front face side 21 of the contact box 1 (not shown). The respective connector 400 is insertable through the front face side 21 into the respective contact module 2 via an opening 270 in the respective slider 20, whereby the connector 400 hits the contact area 213 of the second contact means 200 early in comparison. For trailing plugging, the contact area 213 of the slider 20 lies far from the front face side 21 of the contact module 2 (see FIG. 5) and far from the front face side 21 of the contact box 1 (also not shown). When the respective connector 400 is inserted via the respective opening 270, the connector 400 hits the respective contact area 213 of the second contact means 200 late in comparison.

A positioning of the slider 20 relative to the casing 10 may be carried out automatically (see above) or manually. While positioning the slider 20 relative to the casing 10 and/or the casing 10 relative to the slider 20, at least one wall 122 and/or the base area of the casing 10 may guide these two parts to one another. For further guiding, the slider 20 and the casing 10 may comprise guidance elements 124, 224, wherein the slider 20 particularly comprises a preferably central longitudinal recess 224 and the casing 10 a corresponding rib 124 which may engage into the recess 224 depending on a position of the slider 20 in relation to the casing 10. The rib 124 may also be used for maintaining current clearance and creepage distances for the inner contact elements 104. Further guiding elements are of course applicable.

When the slider 20 is in its correct position at/in the casing 10, the slider 20 may be fixed at/in the casing 10. This also concerns a correct position of at least one contact module 2 in relation to the contact box 1 and/or to a correct position of contact modules 2 among each other. I.e. when the contact modules 2 are in their correct positions, they may be fixed together, whether they are accommodated in a contact box 1 or not. Therefore, a slider 20 and a corresponding casing 10 comprise fixing means 140, 240 with which the slider 20 may be fixed in its casing 10, and whereby the fixing means 140, 240 allow mutual fixing of adjacent casings 10 (and thus sliders 20). Particularly the fixing means 140, 240 are through holes 140, 240 through which a fixing rod (not shown) may be put.

The through holes 140, 240, for instance through bores 140, 240, are arranged laterally in the casing 10, the slider 20 and/or the cover 221 of the slider 20 (large longitudinal sides, see FIGS. 1 to 6). When a plurality of casings 10 are arranged in a row, their preferably single through holes 140 all lie in one line, i.e. these through holes 140 are coaxial. The slidable or moveable sliders 20 and/or covers 221 each comprise a plurality of through holes 240, whereby the number of through holes 240 preferably corresponds to a number of locking positions of the respective slider 20 at/in the respective casing 10. The through holes 240 of a slider 20 are arranged in such a manner that in each locking position of the slider 20 at/in the casing 10, one through hole 240 of the slider 20 lies coaxial with the single through hole 140 of the respective casing 10.

In a fixing position, one of the plurality of through holes 240 of a slider 20 is in a coaxial line with the single through hole 140 of the respective casing 140. This particularly relates to all contact modules 2 of a contact box 1, whereby all through holes 140 of the casings 10 are also in a coaxial line. The fixing rod my now be put through these through holes 140, 240 fastening the sliders 20 and the casings 10 to one another. Here, an outer housing 50 (see FIG. 9) of the contact box 1 may also be fixed by the fixing rod (not shown). According to the invention, the casings 10 and the sliders 20, and/or a plurality of contact modules 2 with their casings 10 and sliders 20 are lockable among each other. In embodiments of the invention, this locked arrangement may also be lockable in a tamper-proof manner or may by be designed in such a manner that the locked arrangement is unlockable, for example manually or especially with a tool, for example a particular tool.

Figure 7:
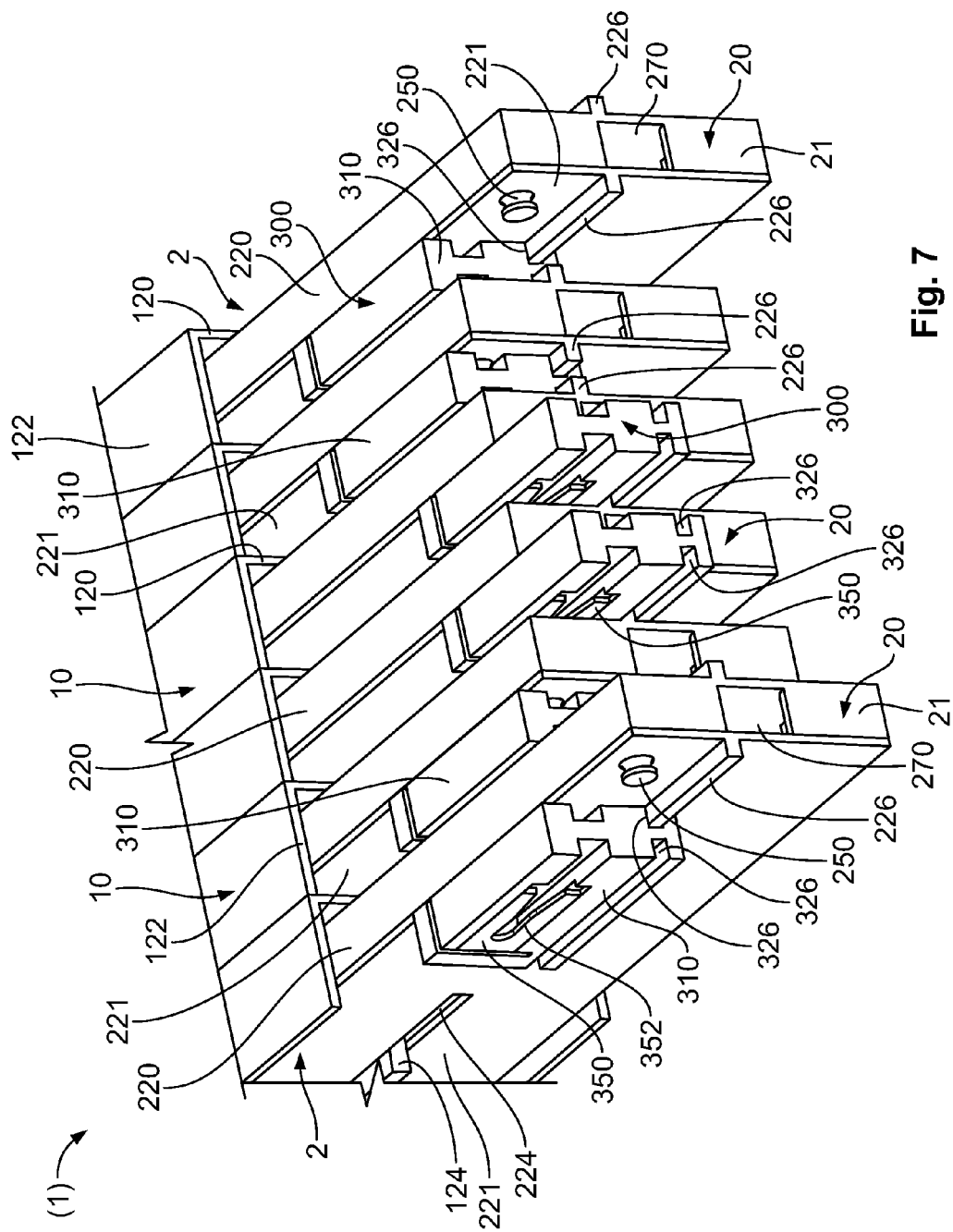
FIG. 7 a partially perspective side view from the above left-hand side onto a second embodiment of the inventive contact box comprising electrical shifters or switches.
Figure 8:
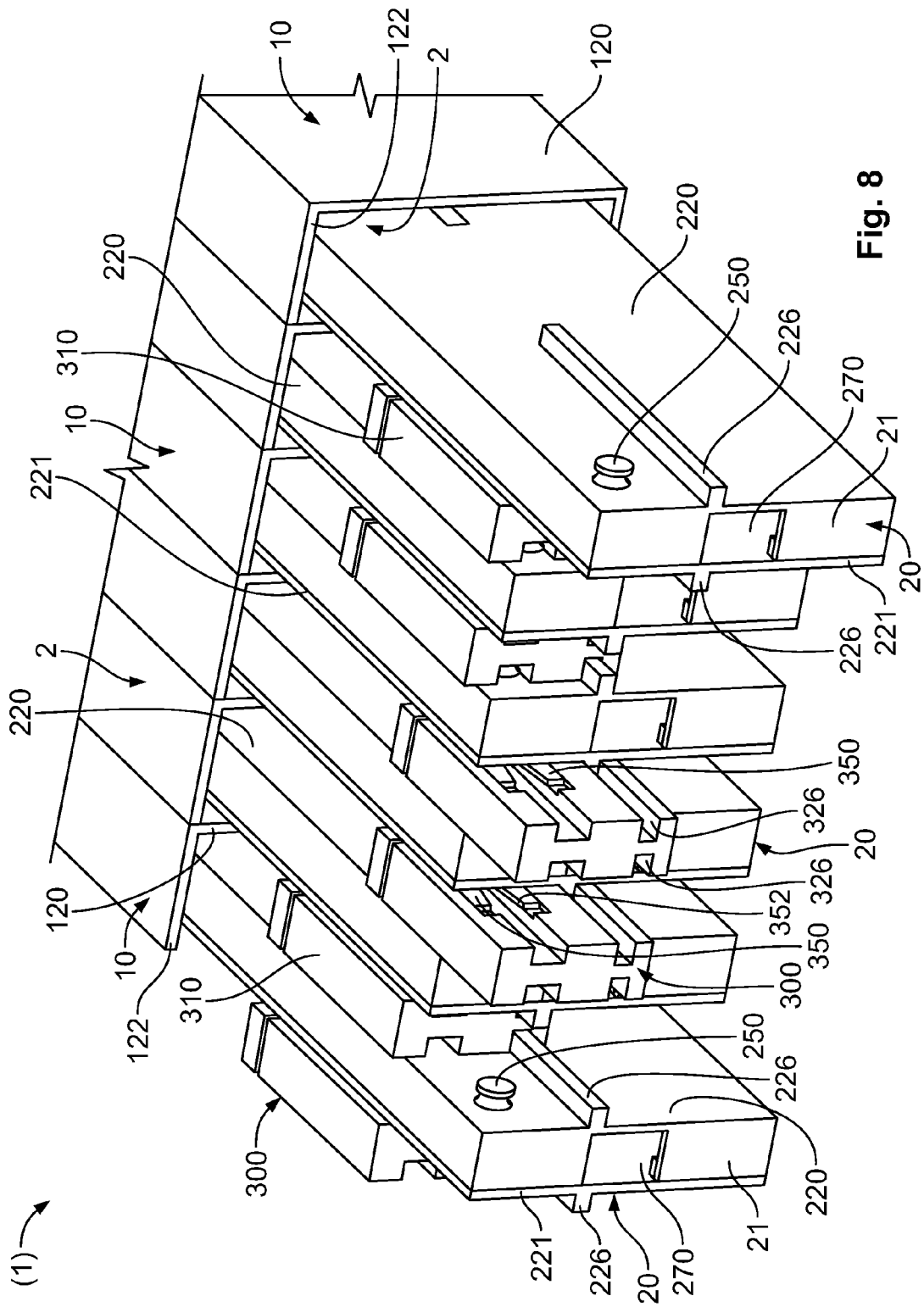
FIG. 8 a partially perspective side view from the above right-hand side onto the contact box from FIG. 7.

In preferred embodiments of the invention, two or more contact modules 2 of a contact box 1 may be electrically connected. Therefore, the respective, preferably all, contact modules 2 of a contact box 1 comprise an electrical switch (only the main parts of them are shown in FIGS. 7 and 8). The electrical switches of a contact box 1 may be operable from and/or apparent at an outer face of the contact box 1 (not shown). Each switch is preferably a slide switch comprising a slidable or moveable shifter 300 as a moveable part of the switch. The shifter 300 preferably comprises a substantially cubical body 310 having an electrical conductor 350, wherein the shifter 300 is preferably located at a respective longitudinal side outside the respective contact module 2.

The shifter 300 bridges the distance between two adjacent contact modules 2, casings 10 (both not shown) or sliders 20 (see FIGS. 7 and 8) and is preferably guided at at least one guidance element 226 at the contact module 2. In the shown embodiment, the guidance elements 226 of the contact modules 2 are constituted as preferably longitudinal ribs 226 which engage in mutual corresponding guidance elements 326 in the respective shifter 300, which for this case are constituted as recesses 326. Also, preferably longitudinal recesses as guidance elements 226 at the contact modules 2, and ribs as mutual corresponding guidance elements 326 at the shifter 300 are applicable. Further, rip-like protrusions and other kinds of guidance elements 226, 326 are applicable.

The guidance elements 226 of one contact module 2 are preferably provided at both large longitudinal sides of the contact module 2, particularly at both large longitudinal sides of the slider 20. Here, one guidance element 226 may be provided at the cover 221 of the slider 20. Furthermore, one or both guidance elements 226 may be provided at the casing 10 (not shown). As shown in FIGS. 7 and 8 which exemplarily show a final configuration of sliders 20 in short casings 10, the shifters 300 are disposed between the sliders 20 on their guidance elements 226, whereby the shifters 300 may electrically connect the sliders 20, irrespective of the positions of the sliders 20 in the casings 10. In the shown embodiment (see FIGS. 7 and 8), the sliders 20 protrude from their casings 10 in contrary to the embodiments shown in FIGS. 1 to 6, wherein the sliders 20 are fully accommodated in their casings 10, irrespective of their positions.

A shifter 300 may electrically connect two sliders 20 in their different extreme positions (cf. FIGS. 3 and 5), whereby the shifter 300 electrically connects electrical contact elements 250 of adjacent contact modules 2. Therefore, the contact element 250 protrudes from the respective slider 20 laterally in both directions, whereby the contact element 250 may be electrically contacted inside the respective slider 20 by the contact means 200 or a contact element 210 of the slider 20 (see FIGS. 3 to 5). In the shown embodiment, the contact element 250 is constituted as a contact pin 250. Also the respective shifter 300 may not electrically contact one or both adjacent contact elements 250 of the respective slider/s 20. The conductor 350 of the shifter 300 is preferably a u- or clamp-shaped conductor 350 which may electrically contact the contact elements 250 of two directly adjacent sliders 20.

The clamp-shaped conductor 350 of the shifter 300 comprises slits 352 or recesses 352 in its legs for receiving the contact elements 250. Here, a base of the conductor 350 preferably fully bridges the space between the outer faces of the two directly adjacent sliders 20. Each slit 352, i.e. a length of the slits 352, of the conductor 350 is designed in such a manner that two directly adjacent contact elements 250 may be received in an electrical manner, irrespective of the relative position of the contact elements 250 among each other. When in both slits 325 of the conductor 250 a contact element 250 of two directly adjacent contact modules 2 is received, an electrically connection of these contact modules 2 is realised. I. e. the contact elements 210 of two directly adjacent contact modules 2 are electrically linked.

Other concrete implementations of the invention are for example: direct current applications for controlling a pilot circuit and/or a main circuit for the prevention of electric arcs, or applications in an explosion-protected area, whereby, for instance in an intrinsically-safe pilot circuit, first of all a signalling contact separates a contactor which in turn separates the pilot circuit. Here, electrical measuring, verifying and/or testing devices, signal lines, controlling apparatuses and primarily hybrid applications thereof may be electrically connected by/to the inventive contact module 2 or the inventive contact box 1. Further, the invention is applicable in any electric distribution device, like a distribution frame, a junction, a voltage or power distributor, a splitter, a terminal block, etc.

What is claimed is:

1. Electric contact module, particularly electric test module, for an electric distribution unit such as an electric voltage or power distribution unit or an installation of an electrical substation of an urban electrical power system, comprising:
   a casing having first electrical contact means electrically connectable by/to a first electric unit,
   a slider having second electrical contact means electrically connectable by/to a second electric unit, wherein the slider may be configured to move between a first position, a second position, and a third position in relation to the casing, and the second electrical contact means of the slider being configured to move with the slider when the slider is moved between the plurality of positions, and an electrical contact element of the slider is electrically contactable by a contact spring of the slider, and
   at least one locking assembly to retain the slider in any of the first, second, and third positions within the casing.

2. Electric contact module according to claim 1, wherein the locking assembly includes the slider and the casing each having mutual corresponding locking elements for mounting the slider at/in the casing, whereby the slider comprises only one locking protrusion and the casing comprises a plurality of locking recesses or locking impressions, or vice versa.

3. Electric contact module according to claim 1, wherein the casing and the slider are designed in such a way that the slider is partially guidable at/in the casing for which purpose the casing and/or the slider comprise a guiding face, a guiding projection and/or a guiding wall.

4. Electric contact module according to claim 1, wherein an electrical connection between the first electrical contact means and the second electrical contact means is at least partially a flexible electrical connection which is achieved by an electrical wire.

5. Electric contact module according to claim 1, wherein the slider is fixable in a plurality of positions relative to the casing, whereby
   the slider comprises a plurality of fixing means and the casing comprises only one fixing means, and
   each fixing means is a through bore through the slider and the casing, respectively.

6. Electric contact module according to claim 1, wherein the electric contact module, or the casing and/or the slider is/are designed in such a manner that
   a relay or a protection relay of the first electric unit and/or an electrical apparatus like a handle or a test-plug handle as second electric unit is electrically connectable.

7. Electric contact box, particularly electric test box, for an electric distribution unit, such as an electric voltage or power distribution unit or an installation of an electrical substation of an urban electrical power system, comprising
   one or a plurality of electric contact modules according to any of the preceding claims, wherein the electric contact box comprises two, three or five electric contact modules or an integer multiple thereof.

8. Electric equipment, particularly electric test system, for an electric distribution unit, such as an electric voltage or power distribution unit or an installation of an electrical substation of an urban electrical power system, comprising
   an electric contact box according to claim 7 and an electrical apparatus like a handle or a test-plug handle.

9. An electric unit, particularly electric distribution unit, such as an electric voltage or power distribution unit or an installation of an electrical substation of an urban electrical power system, comprising:
   an electric contact module including:
      a casing having first electrical contact means electrically connectable by/to a first electric unit,
      a slider having second electrical contact means electrically connectable by/to a second electric unit, wherein the slider may be configured to move between a first position, a second position, and a third position in relation to the casing, and the second electrical contact means of the slider being configured to move with the slider when the slider is moved between the plurality of positions, and an electrical contact element of the slider is electrically contactable by a contact spring of the slider, and
      at least one locking assembly configured to retain the slider in any of the first, second, and third positions within the casing.

10. An electric contact module, particularly electric test module, for an electric distribution unit such as an electric voltage or power distribution unit or an installation of an electrical substation of an urban electrical power system, comprising:
   a casing having first electrical contact means electrically connectable by/to a first electric unit and one fixing means, and
   a slider having second electrical contact means electrically connectable by/to a second electric unit and a plurality of fixing means, wherein the slider may be provided in a plurality of positions in relation to the casing, and wherein the slider is fixable in a plurality of positions relative to the casing, whereby the one fixing means of the casing is a through bore through the casing and the plurality of fixing means of the slider are a plurality of through bores through the slider.

* * * * *